United States Patent
Sugiyama

(10) Patent No.: US 7,459,751 B2
(45) Date of Patent: Dec. 2, 2008

(54) INSULATED GATE SEMICONDUCTOR DEVICE WITH SMALL FEEDBACK CAPACITANCE AND MANUFACTURING METHOD THEREOF

(75) Inventor: Koichi Sugiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 11/216,014

(22) Filed: Sep. 1, 2005

(65) Prior Publication Data
US 2006/0049456 A1 Mar. 9, 2006

(30) Foreign Application Priority Data
Sep. 7, 2004 (JP) ............... 2004-259206

(51) Int. Cl.
*H01L 29/94* (2006.01)
(52) U.S. Cl. ............... 257/340; 257/E29.006
(58) Field of Classification Search ........ 257/213, 257/288, 327, 335, 340, E29.006, E29.007, 257/E29.008, E29.009, E29.01, E29.011; 438/133, 140, 142, 147, 149, 200, 202, 257, 438/284, 400, 454
See application file for complete search history.

(56) References Cited
U.S. PATENT DOCUMENTS
5,623,152 A * 4/1997 Majumdar et al.
6,384,456 B1 * 5/2002 Tihanyi ............ 257/401
2003/0047793 A1 * 3/2003 Disney
2003/0073287 A1 * 4/2003 Kocon ............ 438/259
2004/0041201 A1   3/2004 Sugiyama et al.
2005/0012175 A1 * 1/2005 Tsuruta
2005/0263852 A1  12/2005 Ogura et al.

FOREIGN PATENT DOCUMENTS
JP   8-274301   10/1996

* cited by examiner

*Primary Examiner*—A. Sefer
*Assistant Examiner*—Kevin Quinto
(74) *Attorney, Agent, or Firm*—Oblon, Spivak, McClelland, Maier & Neustadt, P.C.

(57) ABSTRACT

Disclosed is an insulated gate semiconductor device including a first region having a gate electrode region and a first insulating film region surrounding the gate electrode region; a semiconductor region which includes a channel forming region and is disposed to oppose the gate electrode region with the first insulating film region between them; and a second region which has a conductor region buried in a semiconductor region not including the channel forming region disposed to oppose the gate electrode region with the first insulating film region between them, and has a second insulating film region which separates the conductor region from the semiconductor region.

14 Claims, 8 Drawing Sheets

INSULATED GATE SEMICONDUCTOR DEVICE WITH SMALL FEEDBACK CAPACITANCE AND MANUFACTURING METHOD THEREOF

CROSS-REFERENCE TO RELATED APPLICATION

This application is based upon and claims the benefit of priority from the prior Japanese Patent Application No. 2004-259206 filed on Sep. 7, 2004; the entire contents of which are incorporated herein by reference.

BACKGROUND

1. Field of the Invention

The present invention relates to a semiconductor device (insulated gate semiconductor device) having an insulated gate electrode region and a method of manufacturing it, and more particularly to an insulated gate semiconductor device suitable for power use and a method of manufacturing it.

2. Description of the Related Art

Insulated gate semiconductor devices such as a MOSFET and an IGBT (insulated gate bipolar transistor) are widely used as power semiconductor devices which are used in the power electronics field in recent years. In order to make power converters more efficient or more compact, the semiconductor device is demanded not to suffer from a large loss but to have high-speed switching. Measures therefor are considered to decrease a gate capacitance which is parasitically present in a MIS gate structure of the insulated gate semiconductor device.

Meanwhile, there are known problems that when the gate capacitance is decreased, the tolerance to noise is degraded and a malfunction occurs. The gate capacitance is comprised of a parasitic capacitance Cg1 (also called as feedback capacitance) between a gate electrode and a high voltage side main electrode (a drain electrode or a collector electrode) and a parasitic capacitance Cg2 between a gate electrode and a low voltage side main electrode (a source electrode or an emitter electrode). If the capacitance Cg2 is excessively small, the electric potential (namely, gate voltage) of the gate electrode against that of the low voltage side main electrode becomes susceptible to an influence of a noise.

Prior art which improves noise tolerance is disclosed in Patent Literature 1 indicated below. It describes that the capacitance Cg1 is decreased intensively at only a portion where the capacitance Cg1 is structurally generated by increasing the thickness of the gate insulating film. However, this structure requires a special process when it is produced and has a high difficulty level. The reduction of the capacitance Cg1 is limited because it merely depends on the thickness of the formed gate insulating film. [patent Literature 1] Japanese Patent Laid-Open Application No. Hei 8-274301

SUMMARY

An insulated gate semiconductor device according to an aspect of the present invention includes: a first region which is comprised of a gate electrode region and a first insulating film region surrounding the gate electrode region; a semiconductor region which includes a channel forming region and is disposed to oppose the gate electrode region with the first insulating film region between the semiconductor region and the gate electrode region; and a second region which is comprised of a conductor region buried in the semiconductor region not including the channel forming region disposed to oppose the gate electrode region with the first insulating film region between the semiconductor region and the gate electrode region, and a second insulating film region which separates the conductor region from the semiconductor region.

A method of manufacturing an insulated gate semiconductor device according to an aspect of the present invention includes: burying a first region which is comprised of a gate electrode region and a gate insulating film which separates the gate electrode region from a semiconductor region in a groove-like state into the semiconductor region having a laminated structure including an n-type base region and a p-type base region formed on the n-type base region; forming a trench adjacent to the formed first region in the semiconductor region; thermally oxidizing side walls and a bottom of the formed trench; and filling an inside of the trench having the thermally-oxidized side walls and bottom with a conductor to form a second region which is comprised of the thermally-oxidized portions and the conductor.

DETAILED DESCRIPTION

Explanation of Embodiments

Figure 1:
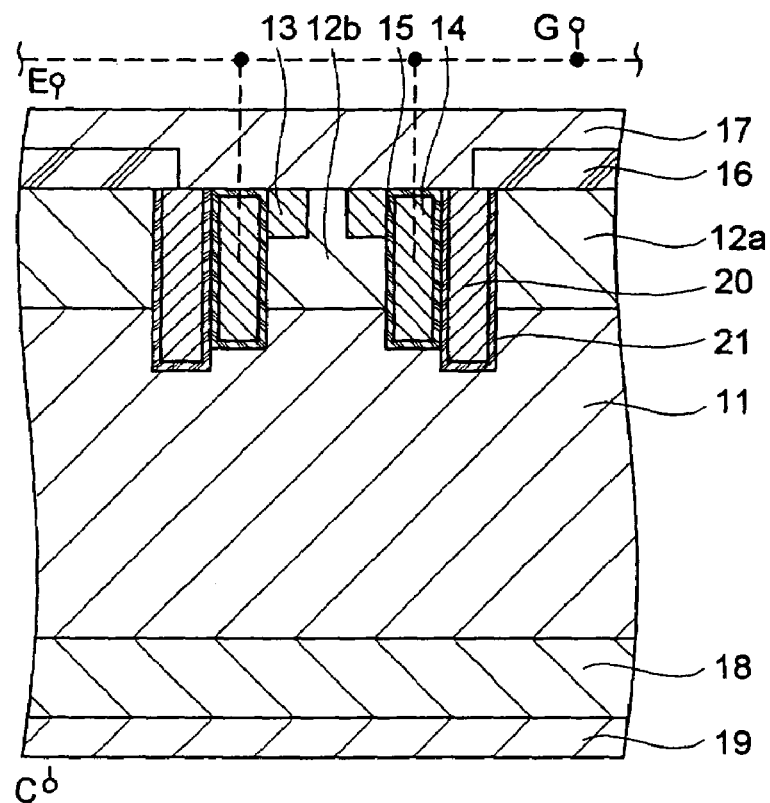
FIG. 1 is a sectional view schematically showing a structure of an insulated gate semiconductor device according to an embodiment of the present invention.

The embodiments of the present invention will be described with reference to the accompanying drawings, which are provided for illustration only and do not limit the present invention in any respect.

An insulated gate semiconductor device according to one aspect of the present invention is being formed to have a second region, which is formed of a conductor region and a second insulating film region for separating the conductor region from a semiconductor region, buried in the semiconductor region that a channel is not formed in. Further, a first region which is formed of a gate electrode region and a first insulating film region surrounding the gate electrode region is disposed to face a semiconductor region with the first insulating film region between them. This semiconductor region includes a region where a channel is formed.

Accordingly, the state of the gate electrode region opposed to the semiconductor region where no channel is formed is an indirect opposed state having the second region at least partly between them. Therefore, a parasitic capacitance formed between the gate electrode region and the semiconductor region becomes low. The semiconductor region is also a region which is electrically conductive to a high voltage side main electrode. Thus, a feedback capacitance only can be made small. Therefore, a high-speed operation becomes possible while keeping noise tolerance.

As a mode of an embodiment, the second region can be configured by burying in a groove-like removed portion of the semiconductor region. Burying in the groove-like removed portion can further increase the area opposed to the gate electrode region and can decrease the direct opposed areas between the gate electrode region and the semiconductor region. Thus, the feedback capacitance can be decreased.

Here, it may be configured that the first region is buried in the groove-like removed portion of the semiconductor region and the second region is disposed to oppose at least the channel forming region of the semiconductor region with the first region between them. The second region is formed in the opposite side of the semiconductor region where the channel is formed with the gate electrode region interposed between the second region and the semiconductor region where the channel is formed.

The groove-like removed portion of the semiconductor region for the second region can be made to have a depth deeper than that of the groove-like removed portion of the semiconductor region for the first region. Thus, the direct opposed surfaces between the gate electrode region and the semiconductor region can be further decreased. Therefore, the feedback capacitance can be decreased furthermore.

As a mode of an embodiment, the conductor region can be configured to be electrically conductive to the electrode of the low electric potential side. The low voltage side electrode is normally an emitter electrode for the IGBT or a source electrode for the MOSFET. Accordingly, the above-described electrical conduction does not increase the feedback capacitance. Because the electric potential of the conductor region is fixed, the conductor region functions as a shield between the gate electrode region and the semiconductor region, and an influence on the gate electrode region resulting from a change in the state of the semiconductor region is decreased (=the feedback capacitance becomes small).

The second region can also have a structure that the conductor region is divided by the second insulating film region. It was configured by a particular manufacturing method such that the insulating film region enters the conductor region.

Further, it is also possible to configure such that the first region is disposed in a laminated state on the top side in a vertical direction of the semiconductor region. There is provided a so-called planar type insulated gate semiconductor device which has a channel formed in a lateral direction.

In view of the above circumstances, the embodiments of the present invention will be described with reference to the accompanying drawings. FIG. 1 is a sectional view schematically showing a structure of an insulated gate semiconductor device according to an embodiment of the present invention, and more specifically, an IGBT as an example of the insulated gate semiconductor device. As shown in FIG. 1, this IGBT has an n-type base region 11, a p-type base region 12b, a p-type dummy base region 12a, an n-type emitter region 13, a gate electrode region 14, a gate insulating film 15 (first insulating film region), an insulating film 16, an emitter electrode region 17, a p-type emitter region 18, a collector electrode region 19, a conductor (polysilicon) region 20 and an insulating film (second insulating film region) 21. The n-type base region 11, the p-type base region 12b, the p-type dummy base region 12a, the n-type emitter region 13 and the p-type emitter region 18 are semiconductor regions.

The illustrated unit is repeatedly disposed in many in the horizontal direction of the drawing, and the same sectional structure as shown in the drawing is disposed in the vertical direction to the drawing sheet excepting the vicinity of ends in the vertical direction to the drawing sheet. The individual gate electrode regions 14 are electrically conductive in the vicinity of the ends in the vertical direction to the drawing sheet to configure a single gate terminal G. The emitter electrode region 17 and the collector electrode region 19 each are formed to cover substantially the whole surfaces of the top and bottom to form an emitter terminal E and a collector terminal C.

When a voltage is applied to the gate electrode region 14, a channel is formed in the p-type base region 12b which is opposed to the gate electrode region 14 with the gate insulating film 15 between them, and electrons are injected into the n-type base region 11. Thus, a pnp transistor having the p-type base region 12b, then-type base region 11 and the p-type emitter region 18 falls in a conductive state. Further, electric current flows from the collector electrode region 19 toward the emitter electrode region 17. The p-type dummy base region 12a is called a dummy region because it does not form a passage for the electric current.

This IGBT has structural characteristics that one side is the channel forming region of the p-type base region 12b and the other side is a region (second region) having the conductor region 20 and the insulating film 21 which covers the side surfaces and the bottom surface of the conductor region 20 with the region (first region) having the gate electrode region 14 and the gate insulating film 15 interposed between them. In other words, it has the second region between the first region and the p-type dummy base region 12a. The conductor region 20 is formed of, for example, polycrystalline silicon (polysilicon) and its top surface is contacted to and electrically conductive to the emitter electrode region 17 (electrode region of the low electric potential side). Here, the second region has a depth deeper than the first region.

Figure 2:
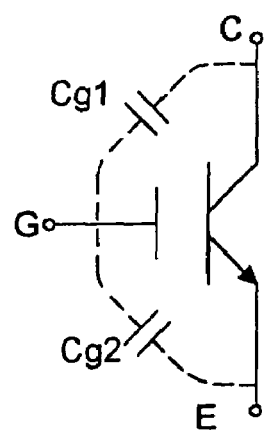
FIG. 2 is an explanatory view showing a parasitic capacitance of the insulated gate semiconductor device shown in FIG. 1.

A gate capacitance in the above structure will be considered with reference also to the equivalent circuit shown in FIG. 2. FIG. 2 is an explanatory view showing a gate parasitic capacitance of the insulated gate semiconductor device shown in FIG. 1. Capacitance Cg1 (feedback capacitance) between the gate and the collector becomes large as the semiconductor region (excepting the channel forming region) opposed to the gate electrode region 14 with the gate insulating film 15 between them becomes large. A large portion of the above area is formed through the second region having the conductor region 20 and the insulating film 21. In addition, the conductor region 20 is electrically conductive to the emitter electrode region 17 to fix an electric potential, and the gate electrode region 14 is in a state that its large portion is shielded against a change in collector voltage. Therefore, the capacitance Cg1 is substantially not present in this part of the gate electrode region 14, so that total Cg1 is reduced to a large degree. The effect is large when the collector voltage as well as the electric potential of the p-type dummy base region 12a and the n-type base region 11 change largely.

Meanwhile, capacitance Cg2 between the gate and the emitter is parasitically present in a portion where the gate electrode region 14 is opposed to the channel forming region with the gate insulating film 15 between them and a portion opposed to the conductor region 20 with the gate insulating film 15 and the insulating film 21 between them. Therefore, the capacitance Cg2 is increased by disposing the second region having conductor region 20 and the insulating film 21. Thus, an IGBT with noise tolerance secured is provided. In addition, the insulating film 21 is formed thicker than the gate insulating film 15, so that, even if the capacitance Cg1 is decreased considerably, the capacitance Cg2 can be also suppressed from increasing, and the IGBT operable at a high speed while securing noise tolerance can be provided.

As described above, the provision of the second region having the conductor region 20 and the insulating film 21 provides the above-described effects. These effects can be used to set the ratio between the capacitances Cg1 and Cg2 to a desired level depending on the noise tolerance and high-speed specifications. To do so, instead of a provision of the insulating film 21 with an appropriate thickness, for example, the second region having the conductor region 20 and the insulating film 21 may be formed to have an appropriate depth smaller than that of the first region, or the second region may be formed discontinuously at intervals in the vertical direction to the drawing sheet.

In FIG. 1, the IGBT was described as an example of the insulated gate semiconductor device, but a similar structure can be applied to the MOSFET. For the MOSFET, the portion of the p-type emitter region 18 may be changed to an n+ region. The emitter electrode region 17 becomes the source electrode, and the collector electrode region 19 becomes the drain electrode. The same is also applied to other embodiments described later.

Then, the method of manufacturing the insulated gate semiconductor device (IGBT) shown in FIG. 1 will be described with reference to FIG. 3A, FIG. 3B, FIG. 4A and FIG. 4B. FIG. 3A, FIG. 3B, FIG. 4A and FIG. 4B are schematic process views schematically showing in cross section the process of manufacturing the insulated gate semiconductor device shown in FIG. 1. The same reference numerals are allotted to the same or equivalent portions as those shown in FIG. 1.

Figure 3A:
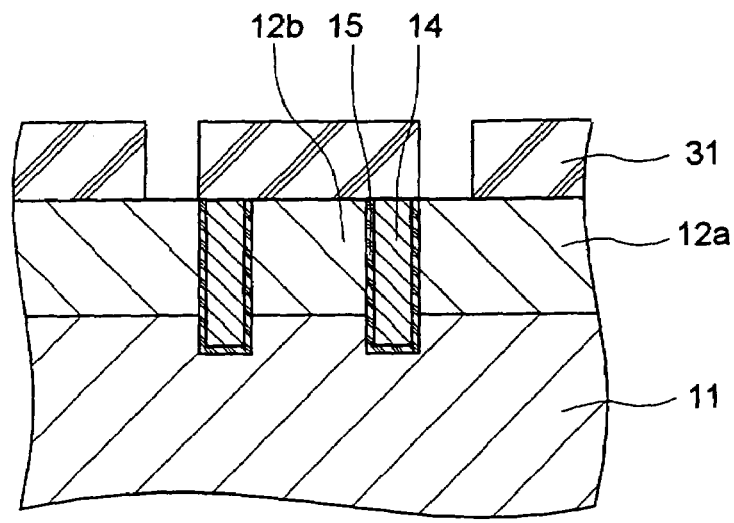
FIGS. 3A and 3B are schematic process views schematically showing in cross section a process of manufacturing the insulated gate semiconductor device shown in FIG. 1.

FIG. 3A shows a process that the first region having the gate electrode region 14 (formed of, for example, polysilicon) and the gate insulating film 15 is formed in the groove-like removed portion of a semiconductor region having a laminated structure consisting of the n-type base region 11 and the p-type base region 12b and the p-type dummy base region 12a which are formed on the top of the n-type base region 11. In this state, a mask 31 is formed on the top surface of the semiconductor region to dispose the second region having the conductor region 20 and the insulating film 21.

Figure 3B:
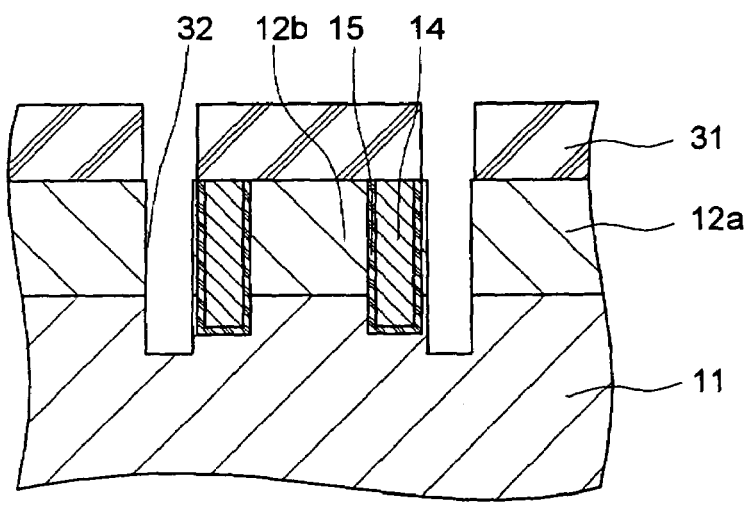
Figure 4A:
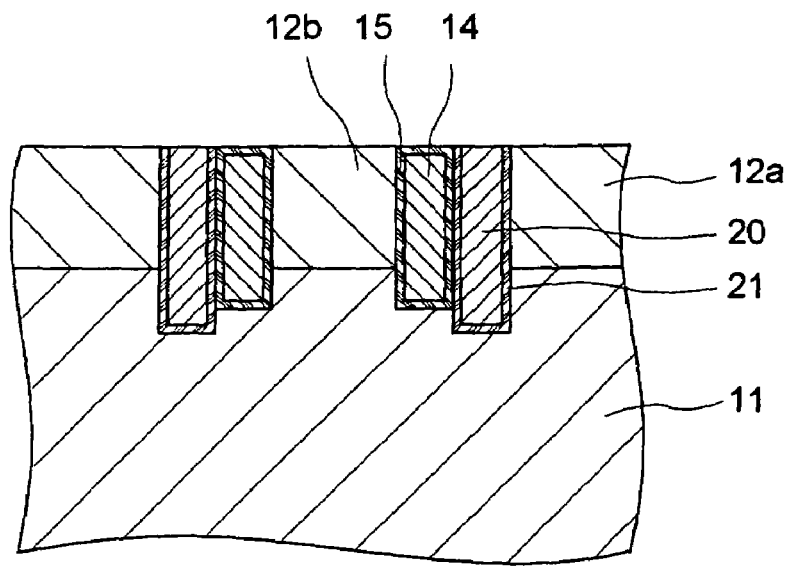
FIGS. 4A and 4B are subsequent to FIG. 3B and schematic process views schematically showing in cross section a process of manufacturing the insulated gate semiconductor device shown in FIG. 1.

Then, the mask 31 is used to form trenches 32 in the semiconductor region by, for example, an RIE (reactive ion etching) method as shown in FIG. 3B. After the trenches 32 are formed, the mask 31 is removed. Then, the insulating film (parts of the insulating film 21 and the gate insulating film 15) is formed on the side walls and bottom of the trenches 32 and also the top surface of the gate electrode region 14 by, for example, thermally oxidizing as shown in FIG. 4A. Subsequently, a polysilicon layer is formed by, for example, a CVD (chemical vapor deposition) method to fill the inside of the insulating film 21 and it is etchbacked to the top surface of the semiconductor region to form the conductor region 20.

Figure 4B:
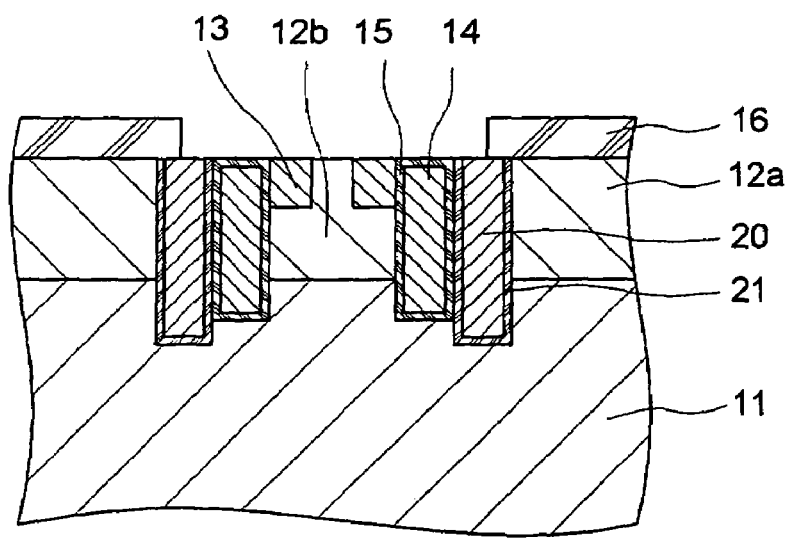

Then, an n type impurity is inplanted into the selected regions of the p-type base region 12b as shown in FIG. 4B to obtain the n-type emitter regions 13. Further, the insulating film 16 is formed by, for example, a CVD on a portion which is not required to be bonded to the emitter electrode region 17. In addition, after a barrier metal layer is formed on the entire surface, the emitter electrode region 17 of, for example, aluminum is laminated and formed. Thus, the IGBT substantially in the state shown in FIG. 1 can be obtained. As described above, the manufacturing process does not require a step having an especially high difficulty level.

To form the mask 31 shown in FIG. 3A, this manufacturing method seems necessary to have openings which are aligned with high accuracy to the position of the first region having the gate electrode region 14 and the gate insulating film 15. However, highly accurate positioning is not required when the openings are formed with their positions slightly displaced toward the individual first regions each of which have the gate electrode region 14 and the gate insulating film 15. It is because even if the gate electrode region 14 is exposed by the trenches 32, the insulating film equivalent to the original gate insulating film 15 is formed by forming the insulating film by the subsequent thermal oxidization or the like. Further, the opening of the mask 31 can also be formed slightly displaced in a direction opposite from the first region as shown in FIG. 3B. In this case, when the trenches 32 are formed, the semiconductor region of the p-type dummy base region 12a remains on the side of the first region, but the semiconductor region disappears when the insulating film is formed by the subsequent thermal oxidization.

Figure 5:
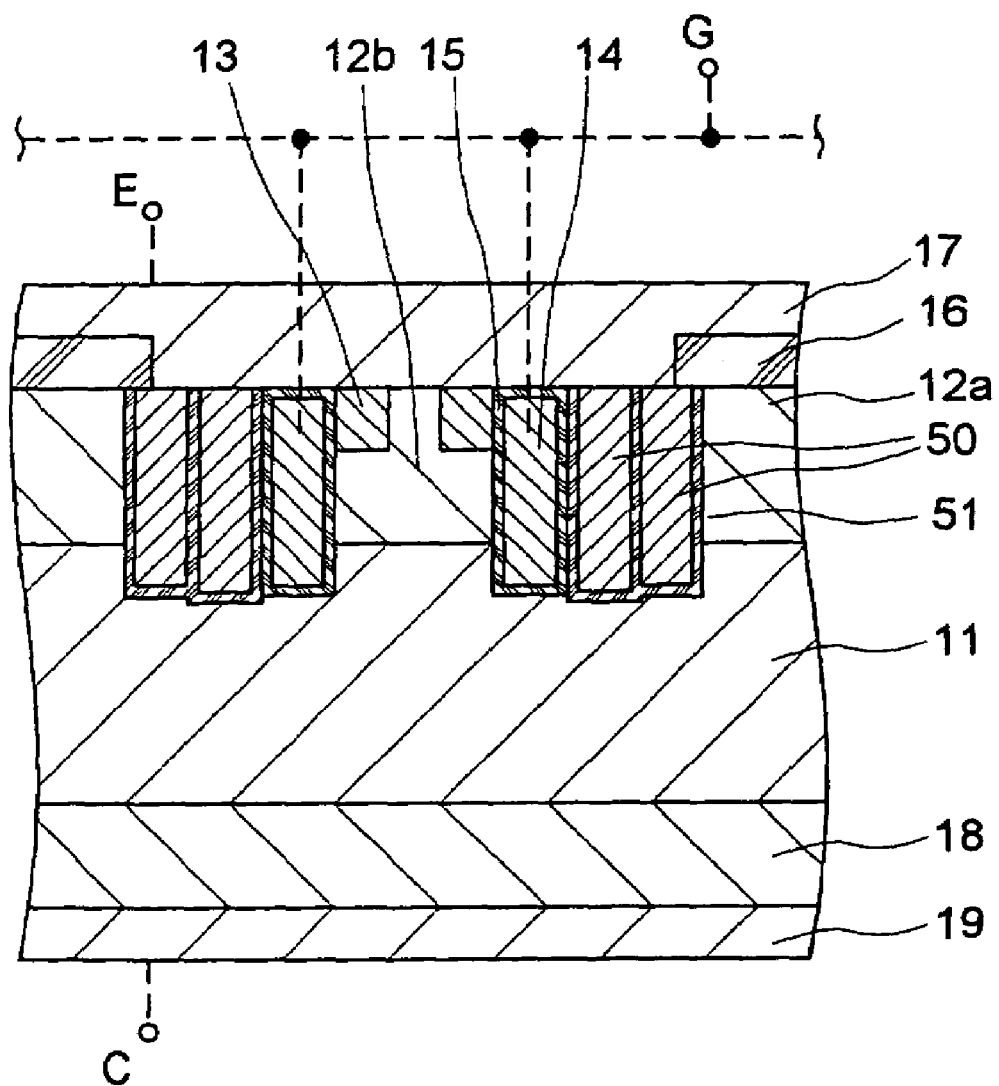
FIG. 5 is a sectional view schematically showing a structure of an insulated gate semiconductor device according to another embodiment of the present invention.

Then, an insulated gate semiconductor device according to another embodiment of the present invention will be described with reference to FIG. 5. FIG. 5 is a sectional view schematically showing a structure of the insulated gate semiconductor device according to this embodiment of the present invention, and more specifically an IGBT as an example of the insulated gate semiconductor device. In FIG. 5, the same reference numerals are allotted to the same or equivalent portions as those shown in the above-described drawings. Descriptions of such portions are omitted unless it is necessary to add any element to them. The illustrated unit is repeatedly disposed in many in the horizontal direction of the drawing, and the same sectional structure as shown in the drawing is disposed in the vertical direction to the drawing sheet excepting the vicinity of ends in the vertical direction to the drawing sheet. It is same to the IGBT shown in FIG. 1.

The IGBT of this embodiment has the second region formed of a conductor region 50 and an insulating film (second insulating film region) 51 different from the second region formed of the conductor region 20 and the insulating film 21 of the IGBT shown in FIG. 1. In this second region, the conductor region 50 is divided by the insulating film 51 as shown in the drawing. The divided conductor regions 50 are bonded to the emitter electrode region 17 so to be electrically conducted to it. One of the divided conductor regions 50, which is on the side of the first region having the gate electrode region 14 and the gate insulating film 15, has substantially the same shape as those of the conductor region 20 and the insulating film 21 of the IGBT shown in FIG. 1. The division of the conductor region 50 by the insulating film 51 is derived from the manufacturing process of the IGBT (described later).

Even by configuring as described above, IGBT which can operate at a high speed while keeping noise tolerance can be obtained because the capacitance Cg1 decreases and the capacitance Cg2 increases somewhat.

FIGS. 6A, 6B, 7A and 7B are schematic process views schematically showing in cross section a manufacturing process of the insulated gate semiconductor device shown in FIG. 5, and the same reference numerals are allotted to the same or equivalent portions as those shown in FIG. 5.

Figure 6A:
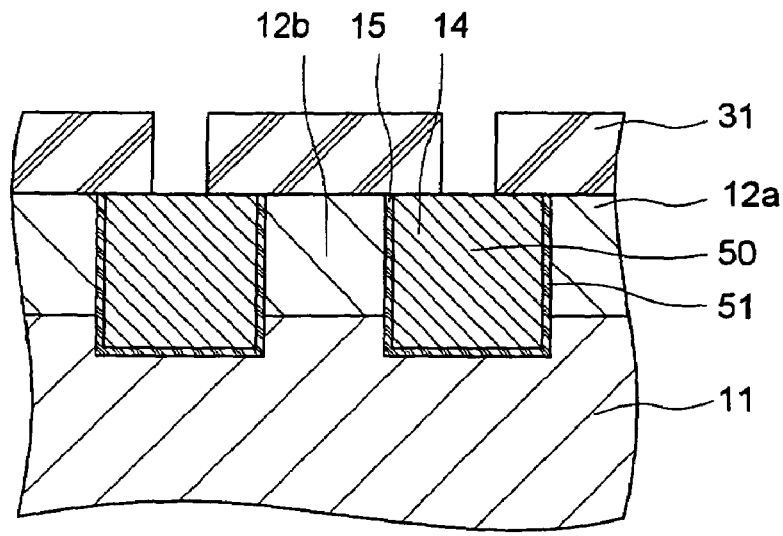
FIGS. 6A and 6B are schematic process views schematically showing in cross section a process of manufacturing the insulated gate semiconductor device shown in FIG. 5.

FIG. 6A shows a step of forming a first region having the gate electrode region 14 and the gate insulating film 15 and a second region having the conductor region 50 and the insulating film 51 in groove-like removed portions of a semiconductor region having a laminated structure consisting of the n-type base region 11 and the p-type base region 12b and the p-type dummy base region 12a which are formed on the top of the n-type base region. Specifically, this manufacturing method collectively forms the gate electrode region 14 and the conductor region 50 in the groove-like removed portions having a large width in advance. Therefore, the gate insulating film 15 and the insulating film 51 (their parts) are also formed collectively. In this state, the mask 31 is formed on the top surface as shown in the drawing.

Figure 6B:
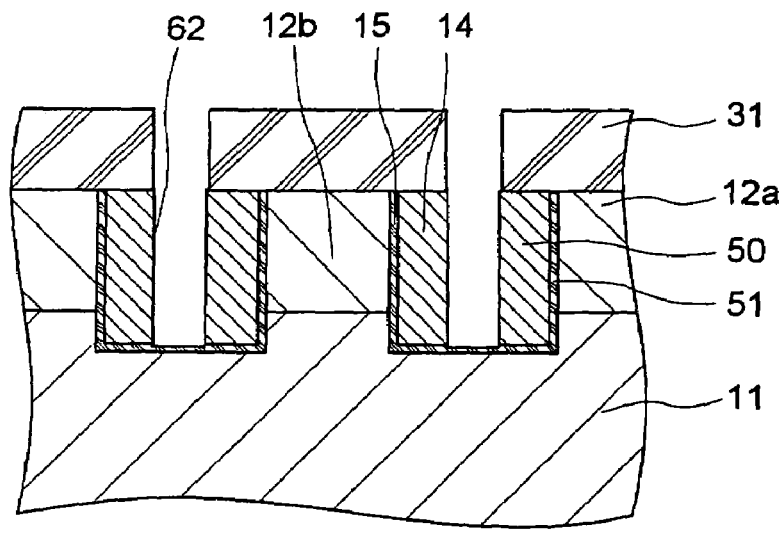
Figure 7A:
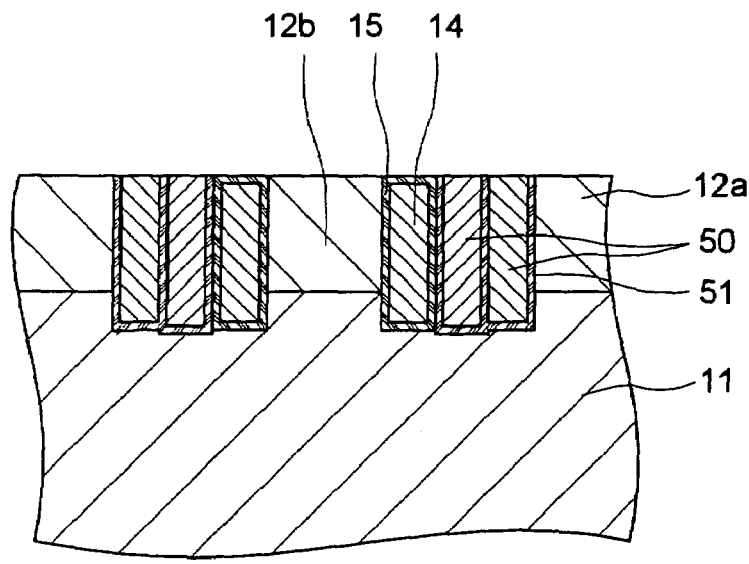
FIGS. 7A and 7B are subsequent to FIG. 6B and schematic process views schematically showing in cross section a process of manufacturing the insulated gate semiconductor device shown in FIG. 5.

Then, the mask 31 is used to form trenches 62 which are formed through the conductor region 50 by, for example, an RIE method as shown in FIG. 6B. The trenches 62 may be formed through the insulating film 51. After the trenches 62 are formed, the mask 31 is removed. Then, an insulating film (the respective parts of the insulating film 51 and the gate insulating film 15) is selectively formed on the side walls and bottom of the trenches 62 and the top surface of the gate electrode region 14 by, for example, thermally oxidizing as shown in FIG. 7A. Subsequently, a polysilicon layer is formed to fill the inside of the formed insulating film 51 by, for example, a CVD method, and it is etchbacked to the top surface of the semiconductor region to form the divided conductor regions 50 as shown in the drawing.

Figure 7B:
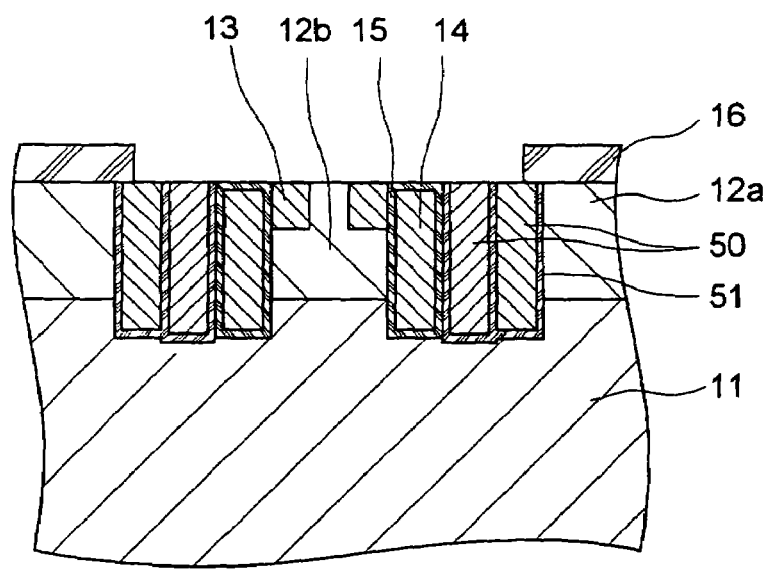

Then, the state shown in FIG. 7B is provided and its description is substantially same as that related to FIG. 4B. Thus, the IGBT having the structure shown in FIG. 5 can be obtained. This manufacturing method has originally a minor difficulty even if accuracy of the formed position of the opening of the mask 31 is made rough. It is because the gate electrode region 14 and the conductor region 50 before the trenches 62 are formed have a width considerably larger than that of the opening of the mask 31.

The inside of the insulating film may be filled with an insulating material instead of polysilicon in the stage of forming the insulating film in the step shown in FIG. 7A before advancing to the next stage, so that the final structure becomes similar to that shown in FIG. 1 than to that shown in FIG. 5.

Figure 8:
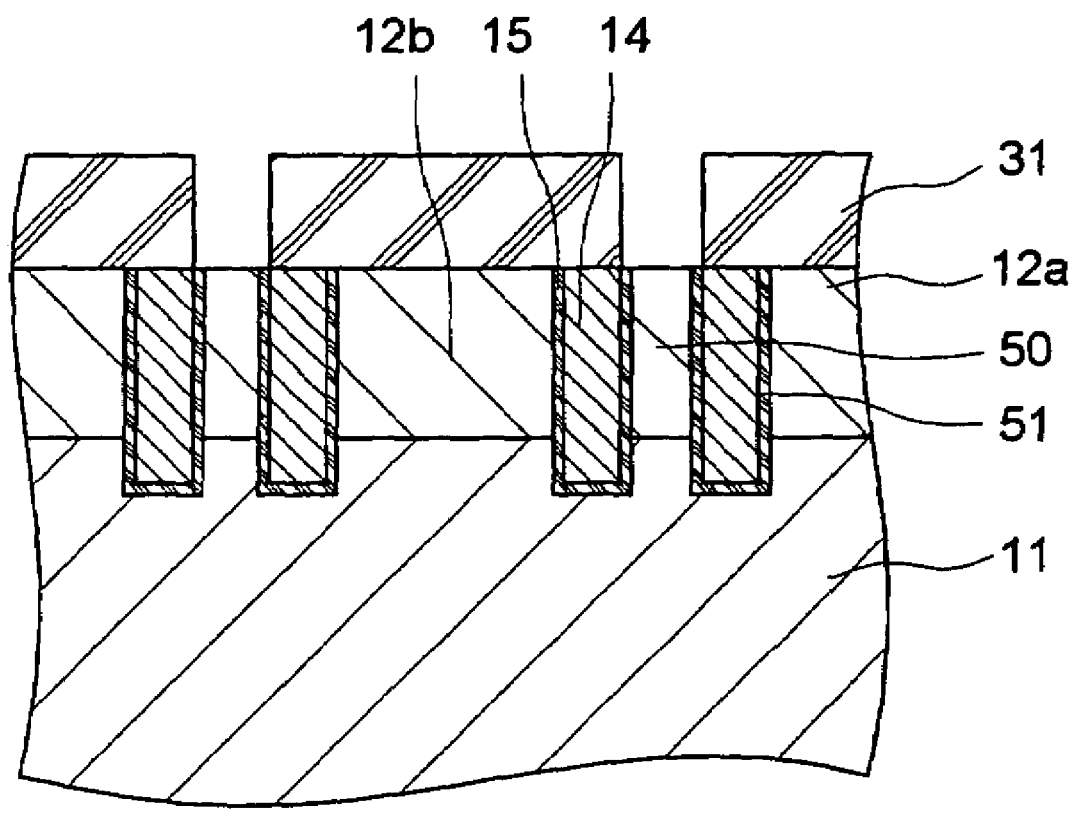
FIG. 8 is a view schematically showing in cross section a modified example of the process shown in FIG. 6A.

FIG. 8 is a view schematically showing in cross section a modified example of the process shown in FIG. 6A. In FIG. 8, the same reference numerals are allotted to the same or equivalent portions as those shown in the above-described drawings. In this modified example, the gate electrode region 14 and the conductor region 50 having a large width are not formed collectively, but they are previously formed in separate parallel groove-like removed portions with a small interval provided between them. Openings of the mask 31 are formed to correspond to the intervals of the separated groove-like removed portions. The following steps are same as those of FIG. 6B and following. Even in this modified example, when the intervals between the groove-like removed portions are determined to be small and the openings of the mask 31 have a large width enough to exceed the intervals, alignment difficulty is alleviated even if the accuracy of its formed position is lowered.

Figure 9:
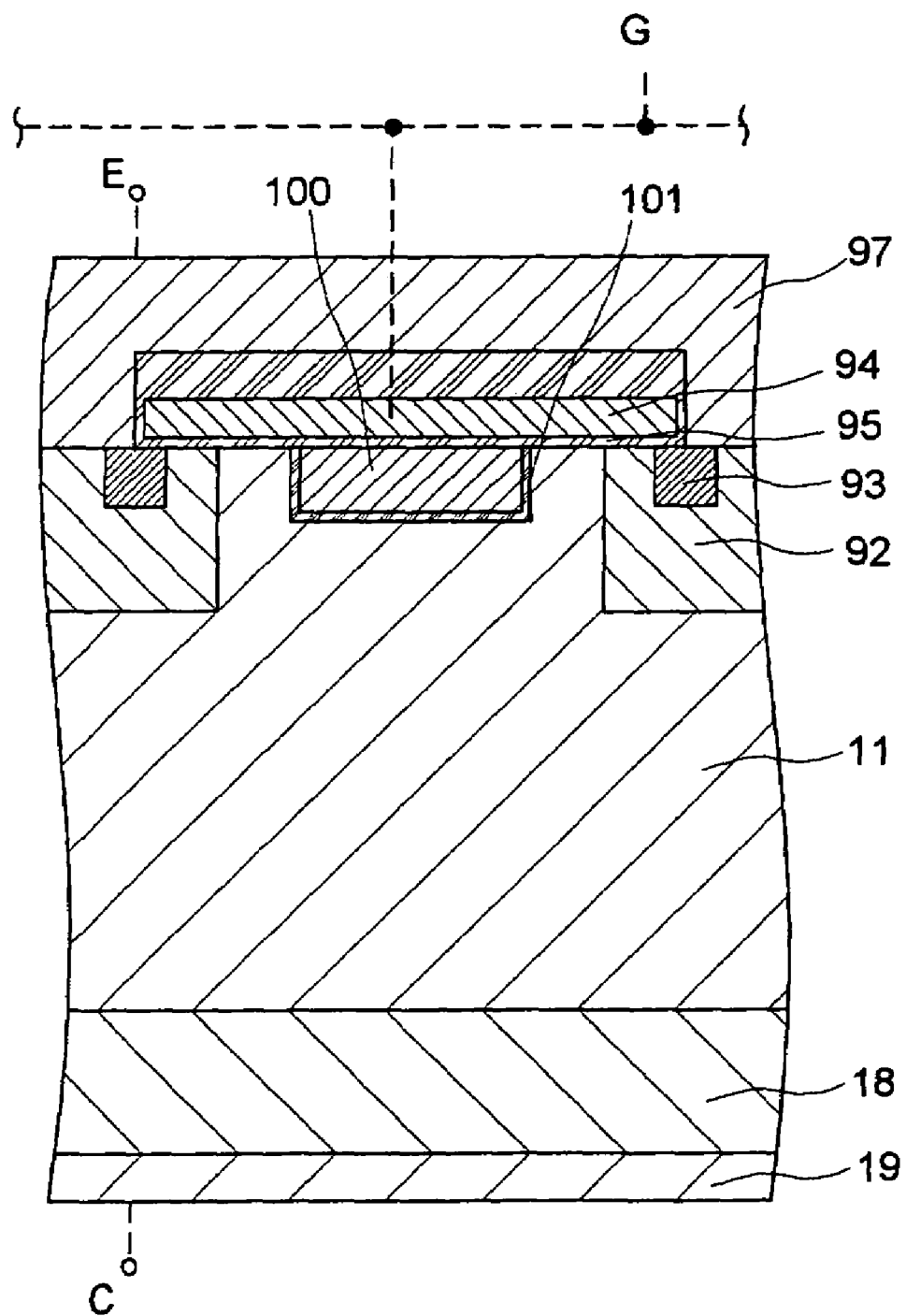
FIG. 9 is a sectional view schematically showing a structure of an insulated gate semiconductor device according to still another embodiment of the present invention.

Then, an insulated gate semiconductor device according to still another embodiment of the present invention will be described with reference to FIG. 9. FIG. 9 is a sectional view schematically showing a structure of an insulated gate semiconductor device (IGBT) according to this embodiment of the present invention. In FIG. 9, the same reference numerals are allotted to the same or equivalent portions as those shown in the above-described drawings. Descriptions of such portions are omitted unless it is necessary to add any element to them. The illustrated unit is repeatedly disposed in many in the horizontal direction of the drawing, and the same sectional structure as shown in the drawing is disposed in the vertical direction to the drawing sheet excepting the vicinity of ends in the vertical direction to the drawing sheet. It is same to the IGBT shown in FIG. 1 and FIG. 5.

This IGBT is a so-called planar type IGBT which has a channel formed in a lateral direction. As shown in FIG. 9, this IGBT has the n-type base region 11, a p-type base region 92, an n-type emitter region 93, a gate electrode region 94, a gate insulating film 95 (first insulating film region), an emitter electrode region 97, the p-type emitter region 18, the collector electrode region 19, a conductor (polysilicon) region 100 and an insulating film (second insulating film region) 101. The n-type base region 11, the p-type base region 92, the n-type emitter region 93 and the p-type emitter region 18 are semiconductor regions. There exists a first region having the gate electrode region 94 and the gate insulating film 95 laminated on the top surface of the semiconductor region.

A channel is formed in the p-type base region 92, which is opposed to the gate electrode region 94 with the gate insulating film 95 between them, by applying a voltage to the gate electrode region 94, and electrons are injected into the n-type base region 11. Thus, a pnp transistor having the p-type base region 92, the n-type base region 11 and the p-type emitter region 18 falls in a conductive state, and electric current flows from the collector electrode 19 to the emitter electrode region 97.

The IGBT has a structural characteristic that a second region having the conductor region 100 and the insulating film 101 is buried in the semiconductor region to oppose the first region having the gate electrode region 94 and the gate insulating film 95. The conductor region 100 is formed of, for example, polysilicon and electrically conductive to, for example, the emitter electrode region 97 in the vicinity of each end in the vertical direction to the drawing sheet.

A gate capacitance in the above structure will be considered below. Capacitance Cg1 (feedback capacitance) between the gate and the collector becomes large as the semiconductor region (excepting the channel forming region) opposed to the gate electrode region 94 with the gate insulating film 95 between them becomes large. In this embodiment, a substantial portion of the area is present through the second region having the conductor region 100 and the insulating film 101. Therefore, its capacitance Cg1 becomes considerably small.

In addition, the conductor region 100 is electrically conductive to the emitter electrode region 97 and electric potential is fixed. Therefore, the major part of the gate electrode region 94 is in a state shielded against a change in collector voltage, and the capacitance Cg1 can be reduced considerably. There is provided a large effect when there is a large change in the collector voltage and the electric potential of the n-type base region 11. Further, there is also a large effect in the IGBT structure having a large gate electrode width.

Meanwhile, the generation of the capacitance Cg2 between the gate and the emitter is caused because the gate electrode region 94 is opposed to the channel forming region, the emitter electrode region 97 and the conductor region 100 with the gate insulating film 95 between them. Therefore, the provision of the second region having the conductor region 100 and the insulating film 101 causes to increase the capacitance Cg2 somewhat. Thus, the capacitance Cg1 decreases and the capacitance Cg2 increases somewhat, so that the IGBT which can operate at a high speed while keeping noise tolerance can be obtained.

As described above, the provision of the second region having the conductor region 100 and the insulating film 101 can provide the above-described effect. The above effect can be used to set the ratio between the capacitances Cg1 and Cg2 to a desired level depending on the noise tolerance and high-speed specifications. To do so, for example, the width of the second region having the conductor region 100 and the insulating film 101 may be varied or divided into plural from that shown in FIG. 9, or the second region may be formed discontinuously at intervals in the vertical direction to the drawing sheet.

It is to be understood that the present invention is not limited to the specific embodiments thereof illustrated herein, and various modifications may be made without deviating from the spirit and scope of the invention as defined by the appended claims.

What is claimed is:

1. An insulated gate semiconductor device, comprising:
a first region having a gate electrode region and a first insulating film region surrounding the gate electrode region;
a semiconductor region including a channel forming region and provided to oppose the gate electrode region with the first insulating film region between the semiconductor region and the gate electrode region; and
a second region buried in the semiconductor region so as to reach a vertical position deeper than the first region and being adjacent to and in contact with the first region, the second region having a conductor region and a second insulating film region to separate the conductor region from the semiconductor region,
wherein the first region is buried in first groove-like removed portions of the semiconductor region; and
wherein the second region is buried in second groove-like removed portions of the semiconductor region, and provided to oppose at least the channel forming region of the semiconductor region through the first region.

2. The insulated gate semiconductor device as set forth in claim 1, wherein the second groove-like removed portions of the semiconductor region for the second region have a depth larger than that of the first groove-like removed portions of the semiconductor region for the first region.

3. An insulated gate semiconductor device, comprising:
a first region having a gate electrode region and a first insulating film region surrounding the gate electrode region;
a semiconductor region including a channel forming region and provided to oppose the gate electrode region with the first insulating film region between the semiconductor region and the gate electrode region; and
a second region buried in the semiconductor region so as to reach a vertical position deeper than the first region and being adjacent to and in contact with the first region, the second region having a conductor region and a second insulating film region to separate the conductor region from the semiconductor region,
wherein the second region is positioned between the first region and the semiconductor region so as to be in contact with the first region and the semiconductor region.

4. An insulated gate semiconductor device, comprising:
a first region having a gate electrode region and a first insulating film region surrounding the gate electrode region;
a semiconductor region including a channel forming region and an emitter region adjacent to the channel forming region, the semiconductor region being provided to oppose the gate electrode region with the first insulating film region between the semiconductor region and the gate electrode region; and
a second region buried in the semiconductor region so as to reach a vertical position deeper than the first region and being adjacent to and in contact with the first region, the second region having a conductor region and a second insulating film region to separate the conductor region from the semiconductor region, the second insulating film region being in contact with the semiconductor region, the conductor region being configured so as to have a same voltage as the emitter region,
wherein the insulated gate semiconductor device is an IGBT.

5. The insulated gate semiconductor device as set forth in claim 4, wherein the second region has the conductor region divided by the second insulating film region.

6. The insulated gate semiconductor device as set forth in claim 4, wherein a channel in the channel forming region is formed in a vertical direction.

7. The insulated gate semiconductor device as set forth in claim 4, wherein a channel in the channel forming region is formed in a lateral direction.

8. The insulated gate semiconductor device as set forth in claim 4, wherein the second insulating film region has a thickness larger than that of the first insulating film region.

9. The insulated gate semiconductor device as set forth in claim 4, wherein the second region is formed in plural discontinuously in a direction along the gate electrode region.

10. The insulated gate semiconductor device as set forth in claim 4, wherein the conductor region has a top surface used to be electrically conductive to the emitter region.

11. The insulated gate semiconductor device as set forth in claim 4, wherein the conductor region is formed of polycrystalline silicon.

12. The insulated gate semiconductor device as set forth in claim 4, wherein the second insulating film region of the second region is formed of silicon oxide.

13. The insulated gate semiconductor device as set forth in claim 4, wherein none of the semiconductor region is disposed between the first region and the second region.

14. The insulated gate semiconductor device as set forth in claim 4, wherein the first insulating film region has portions thereof each having a substantially same thickness and facing with each other through the gate electrode region.

* * * * *